United States Patent
Lee et al.

(10) Patent No.: US 11,205,731 B2
(45) Date of Patent: Dec. 21, 2021

(54) LIGHT SOURCE PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wen Lee, Shiyan (CN); Hsiang-Chih Hung, Pingtung County (TW); I-Ju Chen, Taichung (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 109 days.

(21) Appl. No.: 16/866,763

(22) Filed: May 5, 2020

(65) Prior Publication Data
US 2020/0357934 A1    Nov. 12, 2020

(30) Foreign Application Priority Data

May 7, 2019 (CN) .......................... 201910378781.0
Jan. 3, 2020 (CN) .......................... 202010004739.5

(51) Int. Cl.
*H01S 5/02257* (2021.01)
*H01L 31/0216* (2014.01)
(Continued)

(52) U.S. Cl.
CPC ...... *H01L 31/02164* (2013.01); *H01L 31/125* (2013.01); *H01L 31/167* (2013.01);
(Continued)

(58) Field of Classification Search
CPC ............ H01L 31/02164; H01L 31/125; H01L 31/167; H01S 5/022; H01S 5/02257; H01S 5/02325; H01S 5/0239
See application file for complete search history.

(56) References Cited

U.S. PATENT DOCUMENTS

2004/0042071 A1* 3/2004 Sato ..................... G02B 6/4246
359/355
2018/0010784 A1 1/2018 Kim et al.

FOREIGN PATENT DOCUMENTS

CN    1455960 A    11/2003
CN    1523683 A    8/2004
(Continued)

*Primary Examiner* — Michael Carter
(74) *Attorney, Agent, or Firm* — Li & Cai Intellectual Property (USA) Office

(57) ABSTRACT

A light source package structure is provided. The light source package structure includes a substrate, an upper electrode layer, a light emitting unit, a photodiode, a surrounding wall, a light permeable element, and a coating layer. The substrate includes a first surface and a second surface that is opposite to the first surface. The upper electrode layer is disposed on the first surface of the substrate. The light emitting unit and the photodiode both are disposed on the upper electrode layer. The surrounding wall is disposed on the first surface and is arranged to surround the light emitting unit and the photodiode. The light permeable element is disposed on the surrounding wall. The coating layer is disposed inside of the surrounding wall and is coated on a part of the first surface and a part of the upper electrode layer.

17 Claims, 5 Drawing Sheets

(51) Int. Cl.
*H01L 31/12* (2006.01)
*H01S 5/02325* (2021.01)
*H01S 5/0239* (2021.01)
*H01L 31/167* (2006.01)
*H01S 5/0683* (2006.01)

(52) U.S. Cl.
CPC ........ *H01S 5/0239* (2021.01); *H01S 5/02257* (2021.01); *H01S 5/02325* (2021.01); *H01S 5/0683* (2013.01)

(56) References Cited

FOREIGN PATENT DOCUMENTS

| | | |
|---|---|---|
| CN | 208723309 U | 4/2019 |
| JP | 2010287749 A | 12/2010 |
| JP | 201885448 A | 5/2018 |

* cited by examiner

LIGHT SOURCE PACKAGE STRUCTURE

CROSS-REFERENCE TO RELATED PATENT APPLICATION

This application claims the benefit of priority to China Patent Application No. 202010004739.5, filed on Jan. 3, 2020, and No. 201910378781.0, filed on May 7, 2019, in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source package structure, and more particularly to a light source package structure using a coating layer to converge a light current distribution of a photodiode.

BACKGROUND OF THE DISCLOSURE

Conventional light source package structures mostly use a TO-CAN (Transistor Outline-CAN) package structure. However, as there have been no major structural improvements in recent years, the conventional light source package structures have become increasingly difficult to meet various requirements.

SUMMARY OF THE DISCLOSURE

In response to the above-referenced technical inadequacies, the present disclosure provides a light source package structure to effectively improve on the issues associated with conventional light source package structures.

Therefore, the light source package structure of the present disclosure implements a structure that is different from a TO-CAN (Transistor Outline-CAN) package structure to meet different requirements.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
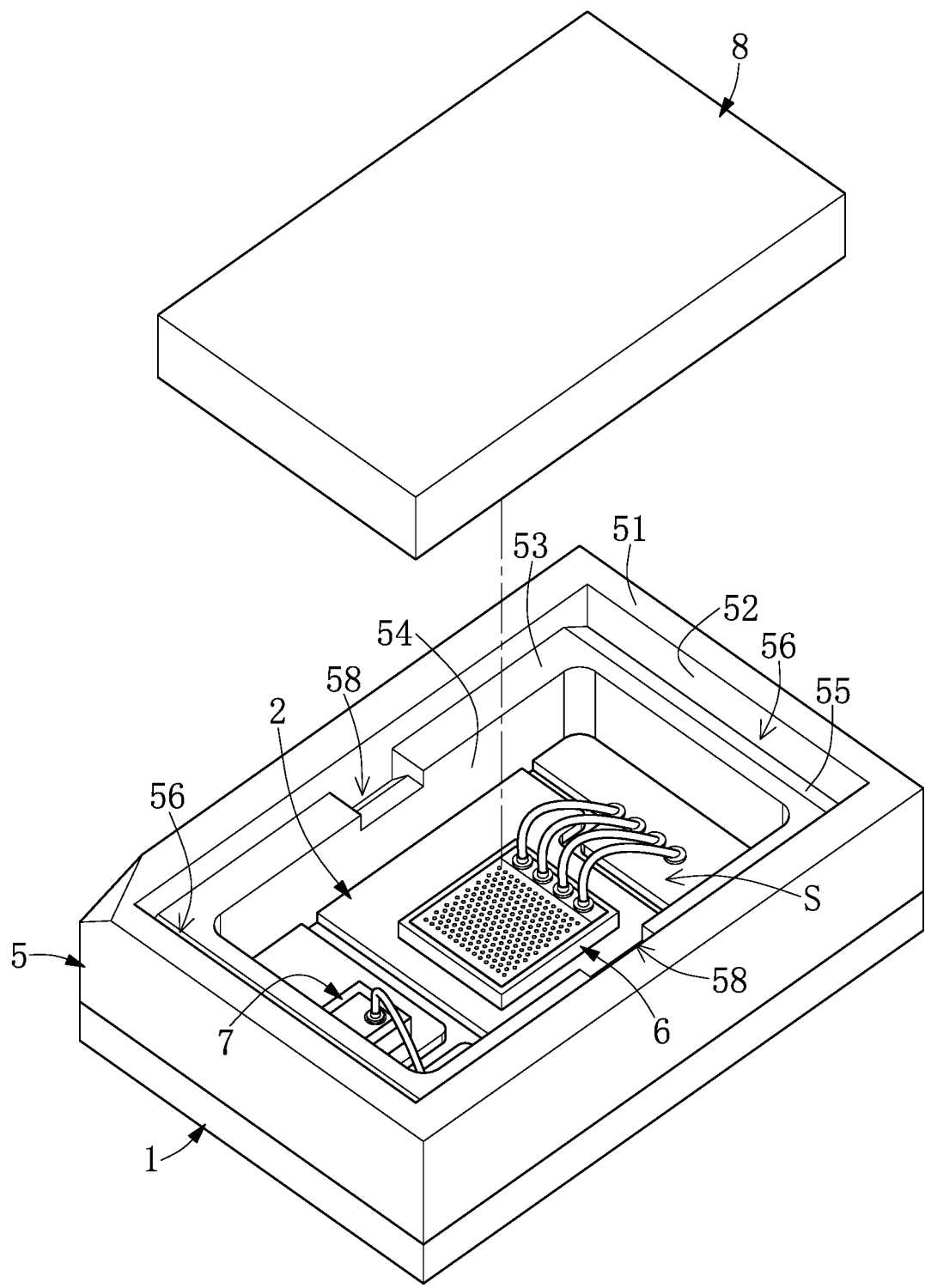
FIG. 1 is a perspective view of a light source package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 6, an embodiment of the present disclosure provides a light source package structure 100, and more particularly to a light source package structure 100 for a 3D sensing, such as the light source package structure 100 applying a vertical cavity surface emitting laser (VCSEL) or an infrared light source, but the present disclosure is not limited thereto. For example, the light source package structure 100 can also apply a LED or a laser.

Figure 2:
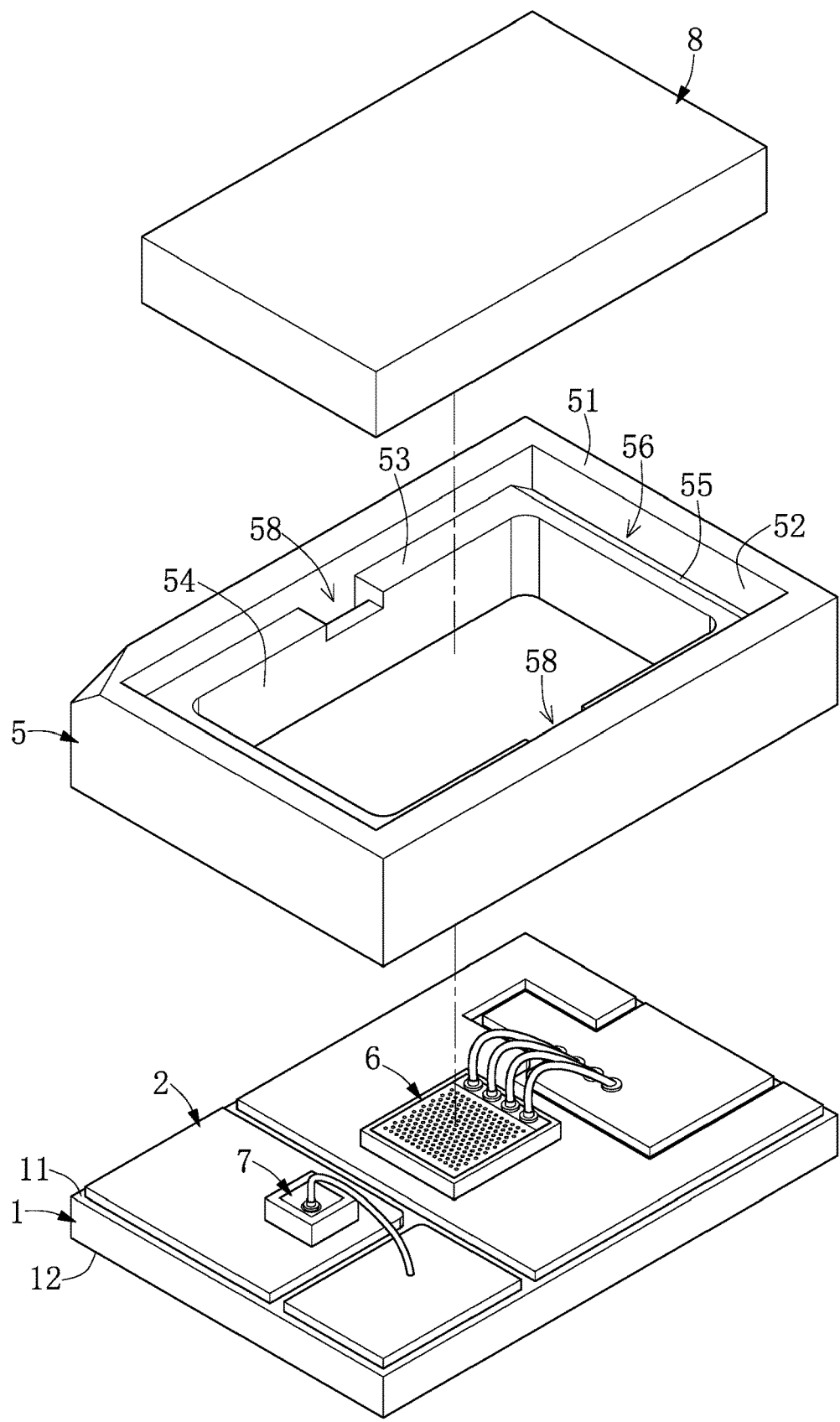
FIG. 2 is an exploded view of FIG. 1 when an adhesive is omitted.
Figure 3:
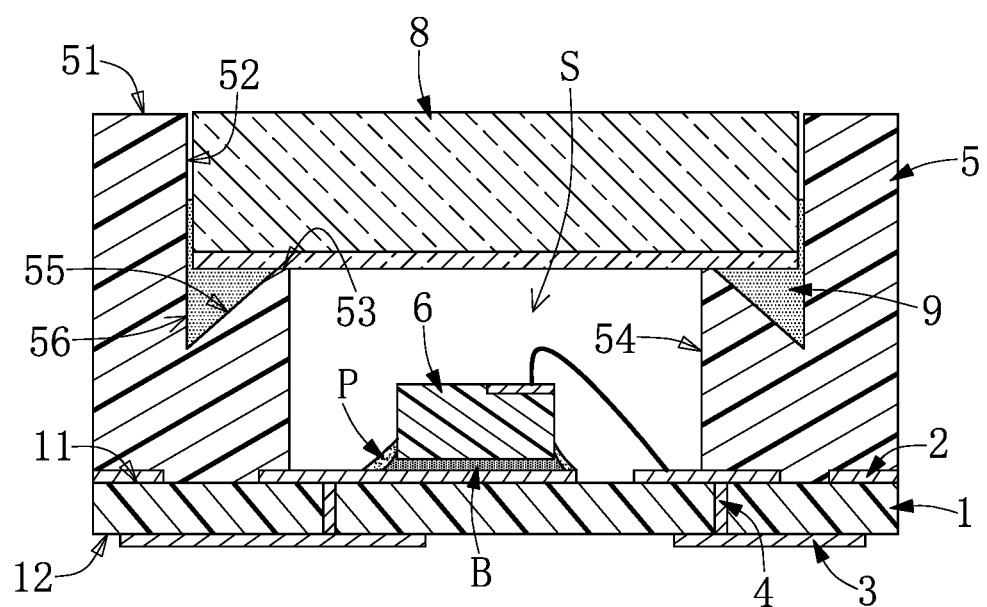
FIG. 3 is a cross-sectional view of FIG. 1.

The light source package structure 100 (as shown in FIG. 1 to FIG. 3) includes a substrate 1, an upper electrode layer 2 disposed on a side of the substrate 1, a lower electrode layer 3 disposed on an opposite side of the substrate 1, a plurality of conducting pillars 4 embedded inside of the substrate 1, a surrounding wall 5 disposed on the substrate 1, a light emitting unit 6 mounted on the upper electrode layer 2, a light permeable element 8 disposed on the surrounding wall 5, and an adhesive 9 connecting and fixing the light permeable element 8 and the surrounding wall 5.

The substrate 1 is substantially a rectangular shape (such as a rectangular shape or a square shape) in the present embodiment. The substrate 1 of the present embodiment is a ceramic substrate and includes a first surface 11 and a second surface 12 that is opposite to the first surface 11. The material of the substrate 1 is not limited to the ceramic, and the material of the substrate 1 can also be a circuit board or other insulating substrate.

The upper electrode layer 2 is disposed on the first surface 11 of the substrate 1, and the lower electrode layer 3 is disposed on the second surface 12 of the substrate 1. The conducting pillars 4 are embedded inside of the substrate 1. Each of the conducting pillars 4 has two ends that are respectively connected to the upper electrode layer 2 and the lower electrode layer 3, so that the upper electrode layer 2 can be electrically connected to the lower electrode layer 3 through the conducting pillars 4.

The surrounding wall 5 is made of the liquid crystal polymer and is disposed on the first surface 11 of the substrate 1. An outer edge of the surrounding wall 5 is coplanar with an outer edge of the substrate 1, and a peripheral part of the upper electrode layer 2 is sandwiched between the above-mentioned surrounding wall 5 and the substrate 1. The surrounding wall 5 is annular with a step structure, and the surrounding wall 5 of the present embodiment is a one-piece molded structure, but the present disclosure is not limited thereto.

Specifically, the surrounding wall 5 includes an upper tread surface 51, an upper riser surface 52 connected to an inner edge of the upper tread surface 51, a lower tread surface 53, and a lower riser surface 54 connected to an inner edge of the lower tread surface 53, each of the above mentioned elements (i.e., 51-54) are sequentially arranged from an outside to an inside of the surrounding wall 5. Furthermore, in the present embodiment, the surrounding wall 5 includes two inclined surfaces 55 that are respectively connected to the upper riser surface 52 and the lower tread surface 53, and the two inclined surfaces 55 are respectively connected to two opposite sides of the lower tread surface 53 (e.g., two short edges of the lower tread surface 53 in FIG. 2).

The upper tread surface 51 is a square annular shape (such as a rectangular annular shape or a square annular shape) and is arranged away from the substrate 1. The upper tread surface 51 in the present embodiment is a top surface of the surrounding wall 5, and the upper tread surface 51 is preferably parallel to the first surface 11 of the substrate 1. The upper riser surface 52 is a square annular shape and is vertically connected to the inner edge of the upper tread surface 51. The lower tread surface 53 is a square annular shape and is disposed at an inner side of the upper riser surface 52. The lower tread surface 53 is preferably parallel to the upper tread surface 51, and a distance between the lower tread surface 53 and the first surface 11 is less than a distance between the upper tread surface 51 and the first surface 11. The lower riser surface 54 is a square annular shape. The lower riser surface 54 is vertically connected to an inner edge of the lower tread surface 53 and is arranged away from the upper tread surface 51. The lower riser surface 54 and the first surface 11 of the substrate 1 jointly define a receiving space S.

Furthermore, one side of each of the two inclined surfaces 55 (e.g., an inner edge of each of the inclined surfaces 55 in FIG. 3) is connected to the lower tread surface 53 to form an angle greater than 90 degrees, and the other side of each of the two inclined surfaces 55 (e.g., an outer edge of each of the inclined surfaces 55 in FIG. 3) and the upper riser surface 52 jointly form an accommodating groove 56 that has an angle less than 90 degrees. That is, positions of the two accommodating grooves 56 of the surrounding wall 5 are opposite to each other, but the present disclosure is not limited thereto. For example, in other embodiments not shown, the surrounding wall 5 can include at least one inclined surface 55 and at least one accommodating groove 56 corresponding in position to the at least one inclined surface 55. That is, the accommodating groove 56 is disposed between the lower tread surface 53 and the upper riser surface 52.

In addition, the surrounding wall 5 has two notches 58 that are recessed from the lower tread surface 53 and the lower riser surface 54 and that are in spatial communication with the receiving space S. The two notches 58 are arranged opposite to each other. The two notches 58 of the surrounding wall 5 are preferably and respectively disposed at a center of the two long edges of the lower tread surface 53. That is, the two accommodating grooves 56 of the surrounding wall 5 and the two notches 58 respectively correspond in position to four edges of the lower tread surface 53, but the present disclosure is not limited thereto. For example, in other embodiments of the present disclosure, the surrounding wall 5 can also have at least one notch 58.

As shown in FIG. 1 to FIG. 3 (the adhesive 9 and the active molecular layer 57 are omitted in FIG. 1 and FIG. 2), in the present embodiment, the light emitting unit 6 is the vertical cavity surface emitting laser (VCSEL) that provides an infrared light. The light emitting unit 6 is disposed inside of the receiving space S, and the light emitting unit 6 preferably corresponds to a center of the first surface 11.

In the present embodiment, the light permeable element 8 is a transparent glass plate and a light-diffusing layer disposed on the transparent glass plate. The light permeable element 8 is disposed on the lower tread surface 53 of the surrounding wall 5 and is spaced apart from the upper riser surface 52 (that is, the light permeable element 8 does not contact the upper riser surface 52). Accordingly, each of the above-mentioned notches 58 defines an air flow channel that is in spatial communication with the receiving space S and an external space.

Furthermore, in the present embodiment, the light permeable element 8 is fixed on the surrounding wall 5 through the adhesive 9, and the light permeable element 8 and the lower tread surface 53 can be closely integrated with each other through the adhesive 9 without a gap. A part of the adhesive 9 is disposed inside of each of the accommodating grooves 56 of the surrounding wall 5.

Figure 4:
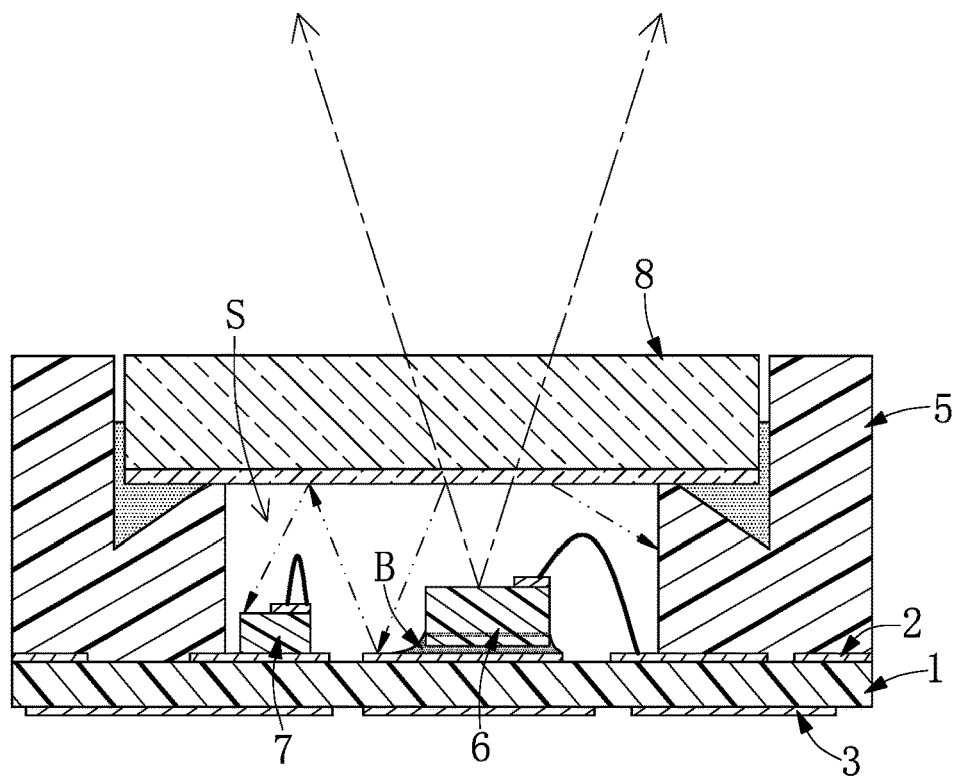
FIG. 4 is a cross-sectional view of the light source package structure without a coating layer according to an embodiment of the present disclosure.
Figure 5:
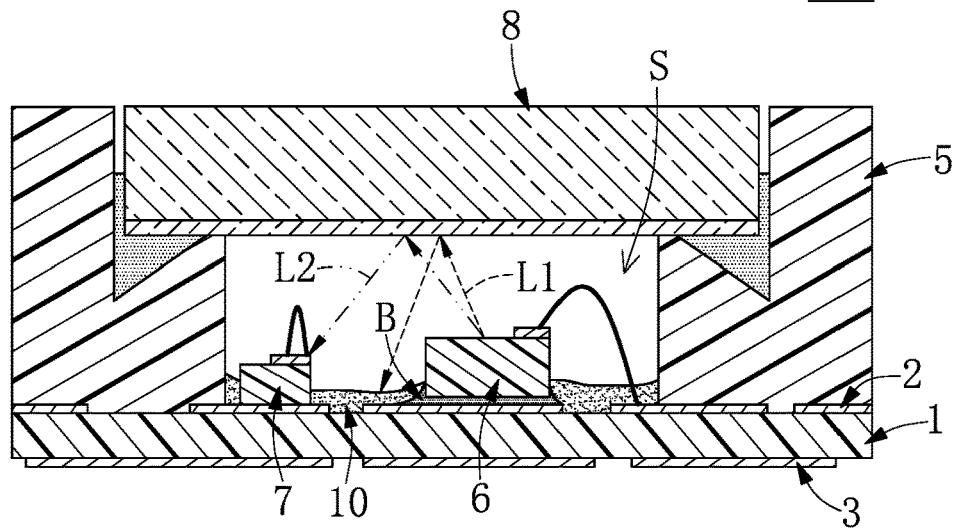
FIG. 5 is a cross-sectional view of the light source package structure with the coating layer according to the embodiment of the present disclosure.
Figure 6:
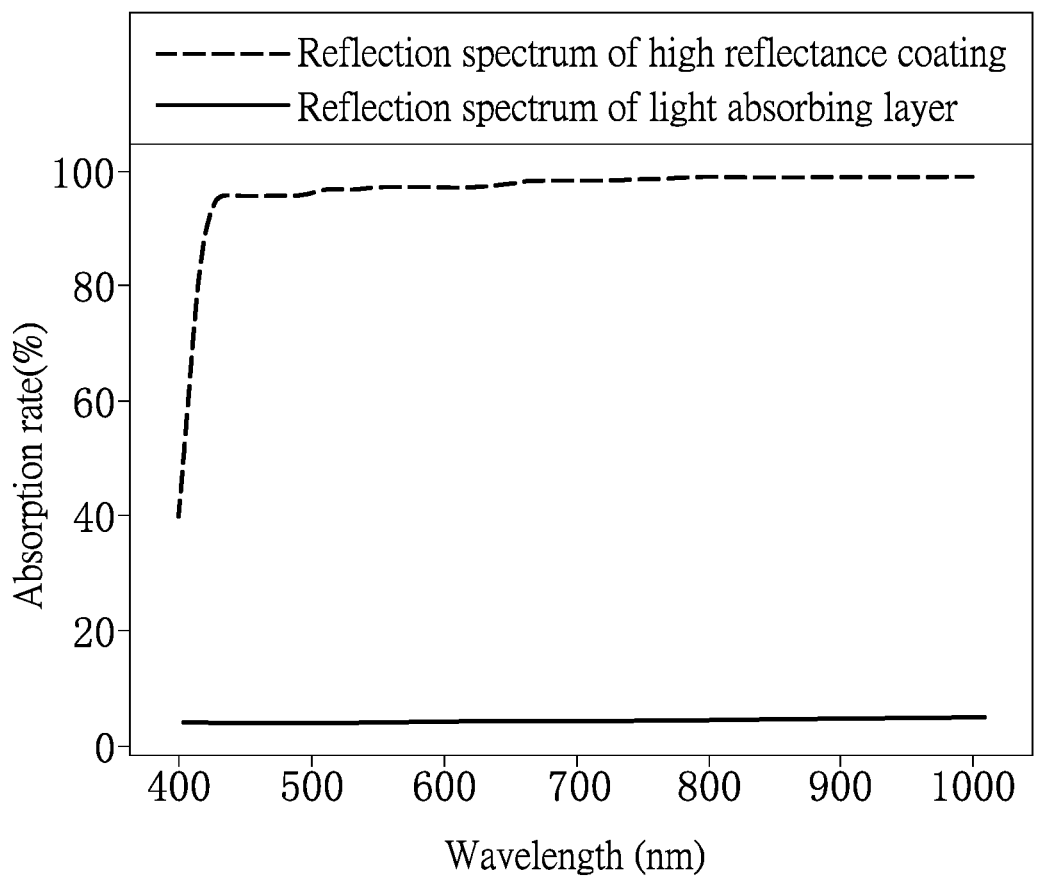
FIG. 6 is a curve diagram of a wavelength of a light emitted by a light emitting unit of the light source package structure and a reflectance of a corresponding coating layer according to the embodiment of the present disclosure.

As shown in FIG. 4 to FIG. 6, the light source package structure 100 of the present embodiment further includes a photodiode 7 (i.e., a photodetector) mounted on the upper electrode layer 2, and the photodiode 7 is disposed inside of the receiving space S. It should be noted that the photodiode 7 can detect the light reflected by the light permeable element 8 or by an inside wall of the surrounding wall 5 to generate a light current signal. If the light permeable element 8 breaks or falls off, the light current signal generated by the photodiode 7 has a difference so that the photodiode 7 triggers the controller to power off the light emitting unit 6 so as to protect viewer's eyes from being hurt due to an excessive light output. The light current signal of the photodiode 7 also has another function that is to feedback a magnitude of the light current to a controller, so as to modify a driving current of the light emitting unit 6 to ensure a constant power output of the light source.

However, a light current signal may be difference due to the light reflection or light absorption of the substrate 1. Specifically, in addition to assembly tolerances of the light source package structure 100, there is a possible reason that a die-bonding adhesive layer B and the substrate 1 absorb all or a part of reflected light that are continuously reflected between the light permeable element 8, the inside of the surrounding wall 5 and the upper surface of the substrate 1. Accordingly, the number of photons reaching the photodiode 7 is different so that the light current has a variation distribution. Furthermore, if there is a difference in a surface roughness of the substrate 1 or an occupied area of the die-bonding layer B, the number of reflections of the reflected light is different accordingly. That is, energy of the light reflected into the photodiode 7 is different due to attenuation.

Accordingly, as shown in FIG. 5, the light source package structure 100 of the present disclosure further includes a light absorbing layer 10 formed on an inner side of the surrounding wall 5 or the upper surface of the substrate 1. The light absorbing layer 10 is a composite resin made of a resin and a light absorbent mixed therewith and is formed by curing. The composite resin before being cured has a viscosity within a range of 600 mPa·s to 6000 mPa·s. The composite resin before being cured has a thixotropic index within a range of 1.4 to 2.5. The light absorbing layer 10 covers part of the first surface 11 and part of the upper electrode layer 2 (the light absorbing layer 10 can also further cover at least part of the side surface of the light emitting unit 6 and at least part of the side surface of the photodiode 7). The light absorbing layer 10 can absorb part of reflected light that is reflected by the light permeable element 8 or the surrounding wall 5.

Specifically, the light absorbing layer 10 can be inorganic or organic materials each selectively absorbing a specific wavelength of light, and can particularly be materials absorbing wavelengths of light emitted by the light-emitting unit 6 (e.g., the light emitting unit 6 can emit a light having a wavelength between λ1 and λ2, and the light absorbing layer 10 can absorb the light having a wavelength in a spectral range that covers the wavelength of λ1-λ2). In addition, a reflectance of the light absorbing layer 10 with respect to a light emitted from the light emitting unit 6 is preferably 50% or less (preferably 10% or less). In one embodiment, a selected light absorbing layer 10 can be a polymer material such as a silicone resin or an epoxy resin that both containing an infrared absorbent. The infrared absorbent can be an organic or an inorganic powder, such as a nano-carbon black or an organic infrared absorbent (as shown in FIG. 6), and the mass fraction of the infrared absorbent is 5% to 20%. The resin material can be the silicone resin, such as a methyl-containing silicone resin or a phenyl-containing silicone resin, and the methyl silicone resin having excellent heat resistance is preferred.

Furthermore, by fully coating or partially coating the light absorbing layer 10 on a variation area of the surface of the substrate 1, the light reflected by the light permeable element 8 can be decreased to a certain degree. Accordingly, the light current generated by the surface reflection of the substrate 1 can be basically ignored, and the surface of the substrate 1 at this time can be defined as the same state.

In addition, as shown in FIG. 5 and FIG. 6, if the light emitting unit 6 can emit an infrared light having a wavelength of 950 nm, the infrared light can be divided into a light L1 and a light L2. The light L1 is absorbed by the light absorbing layer 10 after being reflected by the light permeable element 8. The light L2 can be reflected by the light permeable element 8 and reaches the photodiode 7 so that the light current is generated. Due to the surface roughness of the substrate and the occupied area of the die-bonding layer B may have a little difference for each of the light source package structures, it may result in the divergence of the light current for each of the light source package structures. Accordingly, when the surface of the substrate 1 and the occupied area of the die-bonding layer B can be covered by the light absorbing layer 10, and therefore a divergent light current distribution can be converged accordingly. It provides a better solution to reduce the individual difference for each of light source package structures in manufacturing process.

Furthermore, as shown in FIG. 4, the light source package structure 100 is defined as a control group, and the light source package structure 100 having the light absorbing layer 10 is defined as a first experimental group as shown in FIG. 5. The light source package structure 100 having a high reflectance coating layer instead of having the light absorbing layer 10 is defined as the second experimental group. The high reflectance coating layer is formed by curing the composite resin made of the resin and light reflecting particles mixed therewith, and the light reflecting particles can be one or more combinations of white powders such as white carbon black, aluminum oxide, titanium dioxide, or barium sulfate, but it is not limited thereto. The mass fraction of the light reflecting particles is about 10% to 50%. If a coating thickness of the high reflectance coating layer is different, then the reflectance of the high reflectance coating layer is also different. Accordingly, the content of the light reflecting particles can be optimized and adjusted according to the actual situation.

The silicone resin can be the methyl-containing silicone resin or the phenyl-containing silicone resin, and the methyl silicone resin having excellent heat resistance is preferred. The composite resin before being cured has rheological properties and has a thixotropic index within a range of 1.4 to 2.5. The composite resin before being cured has a viscosity within a range of 1600 mPa·s to 3000 mPa·s. The high reflectance coating layer after being cured has a reflectance with respect to a light having a wavelength of 500 nm to 950 nm, and the reflectance is greater than 80% (e.g., the high reflectance coating layer is a mixture of an addition-reaction silicone resin and a white reflective material). The light absorbing layer 10 is formed by mixing the epoxy resin and the infrared absorber such as the carbon black, and then the light absorbing layer 10 is cured after mixing. The carbon black has a mass fraction that is between 5% and 30%. The carbon black has a reflectance with respect to a light having a wavelength of 500 nm to 950 nm, and the reflectance is less than 10%. The resin for the high reflectance coating layer or the light absorbing layer preferably has the properties of excellent heat resistance and low outgassing characteristic. Accordingly, a contaminated problem, such as the photodiode and the light emitting units are contaminated by the volatile organic small molecules, can be avoided.

Compared with the control group, the light current generated by the photodiode 7 of the first experimental group is decreased by 22.7% on average, and the light current generated by the photodiode 7 of the second experimental group is increased by 16.5% on average. Furthermore, compared with the control group, a light current variation generated by the photodiode 7 of the first experimental group is decreased by 51.1%, and a light current variation generated by the photodiode 7 of the second experimental group is decreased by 7.9%.

According to the above data, it can be known that the light absorbing layer 10 and the high reflectance coating layer each can converge the light current distribution. The principle is that the high reflectance coating layer or the light absorbing layer 10 each can shield a light reflection surface inside of the light source package structure 100, the upper electrode layer 2, the die-bonding adhesive layer B, and a side of the light emitting unit 6, etc. The high reflectance coating layer and the light absorbing layer 10 each has a good consistency in reflection or in absorption of light so that the influence of optical properties caused by variations such as variations of roughness of the upper electrode layer 2 and variations of an overflow area of the die-bonding adhesive layer B can be decreased. The high reflectance coating layer and the light absorbing layer 10 each can completely or partially cover a die-bonding conductive adhesive so that the die-bonding conductive adhesive can prevent a silver ion migration problem in the high temperature and high humidity environment from affecting the reliability of the light source package structure 100.

Based on the material property, the high reflectance coating layer has an uneven surface such as wrinkles and/or depressions during the coating and the curing processes, such that the light reflectance is influenced by the uneven surface. Since the light absorbing layer 10 is provided to absorb light, the light absorption is not influenced by its surface structure (i.e., does not result in a greater absorption change), and therefore the light current distribution of the light absorbing layer 10 is relatively convergent. Accordingly, the light absorbing layer 10 has a greater convergence effect than the high reflectance coating layer.

In addition, in the present embodiment, the high reflectance coating layer or the light absorbing layer 10 each can be defined as a coating layer. The coating layer needs to have rheological properties before being cured so that the coating layer can be fully coated on the substrate 1 or other areas (such as an inside of an arc-shaped metal wire, a gap between the photodiode 7 and the surrounding wall 5). The coating layer also can cover the die-bonding adhesive layer B and has a certain fillet height formed on the side of the light emitting unit 6. That is, the high reflectance coating layer and the light absorbing layer 10 have different thicknesses and coating areas so that a difference between the high reflectance coating layer and the light absorbing layer 10 are provided. Accordingly, the light current distribution of the light source package structure 100 is affected (e.g., the light current distribution of the photodiode is converged).

In conclusion, the light source package structure of the present disclosure implements a structure that is different from a TO-CAN (Transistor Outline-CAN) package structure to meet different requirements nowadays.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source package structure, comprising:
a substrate including a first surface and a second surface that is opposite to the first surface;
an upper electrode layer disposed on the first surface of the substrate;
a light emitting unit and a photodetector both disposed on the upper electrode layer and spaced apart from each other, the light emitting unit provided for emitting a light, the photodetector provided for detecting a reflected light;
a surrounding wall disposed on the first surface of the substrate and surrounding the light emitting unit and the photodetector;
a light permeable element disposed on the surrounding wall to cover the light emitting unit and the photodetector, the reflected light being reflected by the surrounding wall or the light permeable element; and
a coating layer being coated on a part of the first surface and a part of the upper electrode layer, wherein the coating layer is configured to absorb or reflect at least a part of the reflected light so as to converge a light current distribution of the photodetector.

2. The light source package structure according to claim 1, wherein the light emitting unit is configured to emit a light having a wavelength of λ1-λ2, and the coating layer is configured to reflect or absorb the part of the reflected light in a spectral range that covers the wavelength of λ1-λ2.

3. The light source package structure according to claim 1, wherein the coating layer further covers at least part of a side of the light emitting unit or at least part of a side of the photodetector.

4. The light source package structure according to claim 1, wherein the coating layer is a light absorbing layer formed by a resin and a light absorbent mixed therewith, and the resin before being cured has a viscosity within a range of 600 mPa·s to 6000 mPa·s, wherein the resin before being cured has a thixotropic index within a range of 1.4 to 2.5, and wherein the light absorbing layer has a light reflectance is less than 10% with respect to a light having a wavelength of 500 nm to 950 nm.

5. The light source package structure according to claim 1, wherein a reflectance of the light absorbing layer with respect to the light emitted by the light emitting unit is less than or equal to 50%.

6. The light source package structure according to claim 1, wherein a reflectance of the light absorbing layer with respect to the light emitted by the light emitting unit is less than or equal to 10%.

7. The light source package structure according to claim 1, wherein the coating layer includes a resin and an infrared absorbent mixed therewith.

8. The light source package structure according to claim 7, wherein the infrared absorbent is a nano-carbon black or an organic infrared absorbent, and the mass fraction of the infrared absorbent is 5% to 30%.

9. The light source package structure according to claim 7, wherein the resin is a methyl-containing silicone resin or a phenyl-containing silicone resin.

10. The light source package structure according to claim 1, wherein the coating layer is a high reflectance coating layer that is formed by a resin and a plurality of light reflecting particles mixed therewith, wherein the resin before being cured has a viscosity within a range of 1600 mPa·s to 3000 mPa·s, wherein the resin before being cured has a thixotropic index within a range of 1.4 to 2.5, and wherein the high reflectance coating layer has a reflectance is greater than 80% with respect to a light having a wavelength of 500 nm to 950 nm.

11. The light source package structure according to claim 10, wherein the resin is a methyl-containing silicone resin or a phenyl-containing silicone resin.

12. The light source package structure according to claim 10, wherein the light reflecting particles is selected from the groups consisting of white carbon black, aluminum oxide, titanium dioxide, and barium sulfate.

13. The light source package structure according to claim 10, wherein the mass fraction of the light reflecting particles is about 10% to 50%.

14. The light source package structure according to claim 1, wherein the surrounding wall is made of a liquid crystal polymer, and the surrounding wall is annular with a step structure, the surrounding wall includes:
   an upper tread surface arranged away from the substrate;
   an upper riser surface connected to an inner edge of the upper tread surface;
   a lower tread surface disposed at an inner side of the upper riser surface, wherein a distance between the lower tread surface and the first surface is less than a distance between the upper tread surface and the first surface;
   at least one accommodating groove arranged between the lower tread surface and the upper riser surface; and
   a lower riser surface connected to an inner edge of the lower tread surface and arranged away from the upper tread surface, wherein the lower riser surface and the first surface jointly define a receiving space;
   wherein the light source package structure includes an adhesive disposed inside of the at least one accommodating groove, and the light permeable element is disposed on the lower tread surface and is spaced apart from the upper riser surface, and wherein the light permeable element is fixed on the surrounding wall through the adhesive.

15. The light source package structure according to claim 1, wherein the light emitting unit is a vertical cavity surface emitting laser (VCSEL) or an infrared LED, and the photodetector is a photodiode.

16. The light source package structure according to claim 1, wherein the light permeable element is a transparent glass plate and a light-diffusing layer disposed on the transparent glass plate.

17. The light source package structure according to claim 1, further comprising a die-bonding adhesive layer disposed between the light emitting unit and the upper electrode layer, and the die-bonding adhesive layer is partially covered by the coating layer.

* * * * *